United States Patent

[11] 3,562,404

[72] Inventor Robert J. Satriano
Colonia, N.J.

[21] Appl. No. 788,182
[22] Filed Dec. 31, 1968
[45] Patented Feb. 9, 1971
[73] Assignee RCA Corporation of America
a corporation of Delaware

[54] SEMICONDUCTOR DEVICE
5 Claims, 3 Drawing Figs.

[52] U.S. Cl. .......... 174/52, 29/588, 317/234
[51] Int. Cl. .......... H01l 1/12
[50] Field of Search .......... 174/52.5, 52.6, 15, 16, HS; 317/100, 234/1, 234/3, 234/3.1; 264/272; 29/588—590

[56] References Cited

UNITED STATES PATENTS 3,423,516 1/1969 Segerson .......... 174/52.6

*Primary Examiner*—Darrell L. Clay
*Attorney*—G. H. Bruestle

ABSTRACT: A semiconductor device comprises a substrate including two connected transverse portions having an acute included angle. Mounted on a first surface of one of the substrate portions is a semiconductor pellet. The pellet, and portions of the substrate, with the exception of a second substrate surface, are encapsulated within a solid encapsulating material. An opening extends through the device from a surface of the encapsulating material to the substrate second surface. The substrate first surface is transverse to the said encapsulating material surface and at an acute angle with the substrate second surface.

PATENTED FEB 9 1971

3,562,404

INVENTOR

Robert J. Satriano

BY M. Y. Epstein

ATTORNEY

SEMICONDUCTOR DEVICE

BACKGROUND OF THE INVENTION

This invention relates to semiconductor devices.

Certain types of semiconductor devices comprise a substrate, a semiconductor pellet mounted on the substrate, and an enclosure comprising a solid, molded encapsulating material. An opening is provided through the device by means of which the device can be tightly mounted on a chassis, as by means of a screw.

A problem with this arrangement, however, is that the pressure applied against the enclosure, upon the tightening of the screw, is transmitted through the solid encapsulating material to the pellet, often causing undesired changes in the electrical characteristics of the device or even breakage of the pellet or of the means for making electrical connections to the pellet.

A still further problem with such devices is that owing to the difference in thermal expansion between the solid encapsulating material and the substrate on which the pellet is mounted, the encapsulating material often pulls away from the substrate, thereby allowing contaminants to reach the semiconductor pellet and adversely affect it.

SUMMARY OF THE INVENTION

A semiconductor device comprises a substrate, and a semiconductor pellet mounted on a first surface of the substrate. The pellet and portions of the substrate, with the exception of at least one surface of the substrate are encapsulated in a solid molded enclosure. A hole extends through the enclosure and the substrate between a surface of the enclosure and the unencapsulated substrate surface. The substrate first surface on which the pellet is mounted is transverse to the enclosure surface and at an acute angle to the unencapsulated substrate surface.

DESCRIPTION OF PREFERRED EMBODIMENTS OF THE INVENTION

Figure 1:
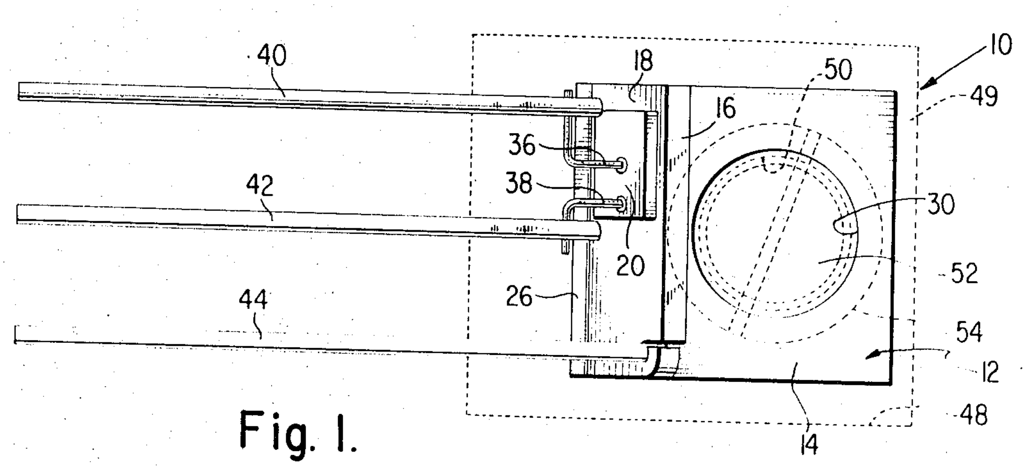
FIG. 1 is a plan view of a semiconductor device made in accordance with the present invention.

With reference to the drawing, a semiconductor device 10, a transistor in this embodiment, is shown which comprises a metal substrate 12 of, for example, nickel or gold plated copper. The substrate 12 includes a rearwardly extending portion 14, and an upwardly extending portion 16, the included angle A between the two portions 14 and 16 being an acute angle, e.g., 60°. Mounted on the front surface 18 of the portion 16 is a semiconductor pellet 20 having an emitter, base, and collector electrodes. The collector electrodes is electrically connected to the bottom surface of the pellet 20 and is thus electrically connected to the substrate 12. Although not illustrated, the pellet 20 is preferably coated with a first body (not shown) of encapsulating material, such as a high purity silicone resin, for protecting the pellet surface.

Projecting outwardly from the surface 18 is a lip 26. The lip 26 is an extension of the lower surface 28 of the portion 14. The purposes of the lip 26 appear hereinafter. The angle B formed by the two surfaces 18 and 28 is an acute angle, e.g., 60°

Extending through the substrate portion 14 is a mounting opening 30.

Figure 2:
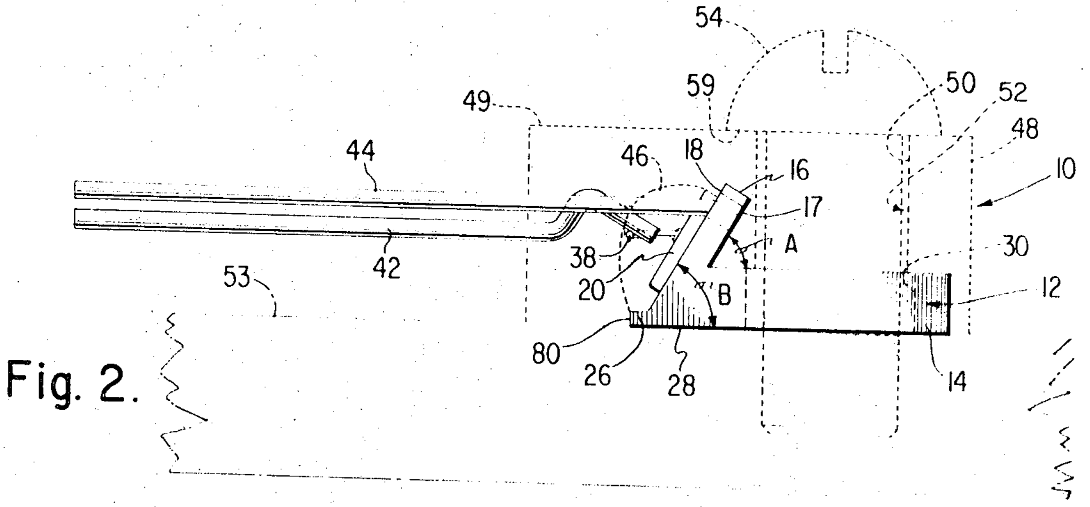
FIG. 2 is a side view of a device shown in FIG. 1.

Two fine wires 36 and 38 are connected to the emitter and base electrodes, respectively, of the pellet 20, the wires 2 36 and 38 being connected, in turn, to two heavier wires 40 and 42, respectively. The fine wires 36 and 38 are wholly encapsulated within a second body 46 of a rubber like encapsulating material (shown in dashed lines in FIG. 2), such as flexible silicon resin, which abuts against the lip 26. The purpose of the encapsulating material is described hereinafter. A third wire 44 is rigidly secured to the substrate, as by being mechanically swaged between the walls of a slot 45 (see FIG. 3) in the substrate. The wire 44 is electrically connected through the substrate 12, to the collector electrode of the pellet 20.

Encapsulating substantially all of the substrate 12, with the exception of the surface 28, is a third enclosure body 48 of a plasticlike, solid encapsulating material (shown in dashed lines in FIGS. 1 and 2), such as a known silicone molding resin. The encapsulating material body 48, along with the substrate surface 28, serve as the enclosure 49 of the device 10. An opening 50 extends through the solid encapsulating material body 48 and forms, in connection with the opening 30 through the substrate 12, a device mounting opening 52. The wires 40, 42, and 44 extend outwardly through the encapsulating material body 48 and serve as terminals of the device.

The device 10 can be mounted on a chassis by connecting the terminals to suitable posts or a socket on the chassis. Additionally, to provide a more rigid mounting of the device on a chassis 53 (FIG. 2), and to provide heat sinking for the device, a screw 54 (shown in dashed lines in FIG. 2) is inserted through the device hole 52 and screwed into a threaded opening in the chassis. The unencapsulated surface 28 of the device is pressed firmly against the chassis surface thereby providing a path for heat from the device to the chassis.

In the assembly of the device 10, a semiconductor pellet 20 is mounted, as by soldering, on the surface 18 of the substrate 12 having an open slot 45 on one side thereof. The fine wires 36 and 38 are then bonded, as by soldering, to electrodes (not shown) on the surface of the pellet 20. The pellet 20 is then coated with the surface protecting resin, as by means of an eye dropper, or the like.

Figure 3:
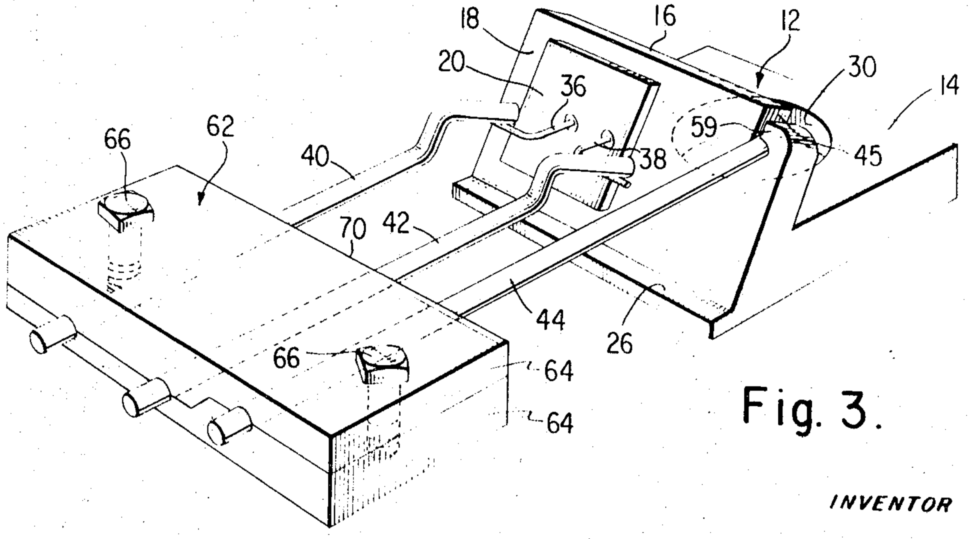
FIG. 3 is a view in perspective illustrating one step in the fabrication of the device shown in FIGS. 1 and 2.

The substrate 12 is then positioned, as shown in FIG. 3, adjacent to a clamping means 62 having a pair of opposed jaws 64 between which are clamped the terminal wires 40, 42, and 44. The jaws 64 are detachably clamped together by means of bolts 66. The substrate is so positioned to dispose the terminal wire 44 within the substrate slot 45 and the terminal wires 40 and 42 across the fine wires 36 and 38. The outer wall 59 of the slot 45 is then inwardly swaged or crimped over to rigidly clamp the terminal wire 44 in place, and the two fine wires 36 and 38 are then connected, as by welding, to the two terminal wires 40 and 42, respectively.

The second encapsulating material body 46 is then deposited onto the substrate, using a known type dispenser, to encapsulate the pellet 20, the fine wires 36 and 38 and at least the junctions of the wires 36 and 38 with the terminal wires 40 and 42. One purpose of the lip 26 is to prevent the encapsulating material body 46, which has a viscous consistency when first applied, from flowing off the surface 18 and onto the surface 28.

After curing the second encapsulating material body 46, the third encapsulating material body 48 is then molded, in a known manner, around portions of the substrate 12 and the extending terminal wires 40, 42, and 44. The encapsulating material body 48 covers the wall of the opening 30 through the substrate 12, and the back side 17 of the upwardly extending portion 16, thereby electrically insulating the substrate 12 from the screw 54 used in the mounting of the device on a chassis.

The clamping means jaws 64 are then separated to release the terminal wires of the finished device.

Although only the assembly of a single device 10 has been described, in practice, a plurality of devices are preferably assembled at the same time. That is, the jig 62 is made elongated so as to hold a plurality of spaced groups of three terminal wires. A jig, not shown, is used on which a plurality of substrates 12 are mounted for disposing the substrates in proper relation with the terminal wires 40, 42, and 44, extending from the jig 62. The subsequent operations of slot swaging, wire bonding, pellet encapsulation, and envelope molding, can all be performed using mass production techniques.

Advantages of devices of the type herein described are as follows:

The device has terminals having a circular cross section. This is desirable both for reasons of greater strength and flexibility of the terminals, and because the device can be mounted in sockets which have circular cylindrical openings and which cannot accept devices having flat terminals. Thus, devices of the present invention can be substituted directly for more expensive devices having conventional glass and metal stems and circular cross section terminals, e.g., such as devices in TO–5 envelopes.

Because the pellet 20 is mounted on a surface 18 transverse to the device external surfaces 59 and 28 (see FIG. 2) between which pressure is applied by the mounting screw 54 in the mounting of the device, the screw pressure transmitted to the pellet 20 is greatly reduced. This reduces the possibility of breakage of the pellet 20 or the fine wires connected thereto.

Disposing the substrate surface 18 at an angle other than 90° with respect to the device surfaces 28 and 59 allows a reduction in the height of the device. Disposing the surface 18 at an acute angle with respect to the surface 28 reduces the heat path between the pellet 20 and the surface 28, thus increasing the efficiency of the heat sinking of the device.

The various known encapsulating materials usable for the device envelope 49 generally have coefficients of thermal expansion greater than the various metals, e.g., copper, steel, or the like, which are used for the substrate 12. One problem caused by this is that the differential expansion between the encapsulating material body 48 and the substrate 12 upon changes in device temperature gives rise to mechanical stresses which could cause breakage of the fine connecting wires 36 and 38. This is prevented by encapsulating the pellet and wires in the rubberlike encapsulating material body 46. The material of the body 46 yields and absorbs stresses applied thereto, thus preventing the stresses from reaching and damaging the pellet or wires.

Another problem caused by the differential expansion between the encapsulating material body 48 and the substrate 12 is that the envelope body may pull away from the surface of the substrate at an external junction of the envelope body and the substrate, e.g., at the junction 80 (FIG. 2) of the material of the body 48 and the substrate surface 28. The presence of the extending lip 26, however, serves as a means to anchor the encapsulating material of the body 48 to substrate 12, as well as increasing the distance between the junction 80 and the pellet 20, thereby reducing the possibility of ambient contaminants reaching the pellet. Also, the inclination of the two substrate portions 14 and 16 towards one another provides a means for anchoring the encapsulating material of the body 48 to the substrate.

I claim:

1. A semiconductor device comprising:
   - a substrate having first and second surfaces disposed at an acute angle relative to one another;
   - a semiconductor pellet mounted on said first surface of said substrate;
   - a solid, molded enclosure encapsulating said pellet and portions of said substrate, said enclosure leaving exposed said substrate second surface;
   - said substrate and said enclosure having a continuous opening therethrough extending between one surface of said enclosure and said substrate exposed second surface;
   - said substrate first surface being transverse to said envelope one surface; and
   - terminals electrically connected to different portions of said pellet extending outwardly from said enclosure.

2. a semiconductor device as in claim 1 wherein said substrate comprises two connected transverse portions having an acute included angle, said first surface being on one of said portions, and said second surface being on the other of said portions.

4. A semiconductor device as in claim 1 wherein;
   - at least one of said terminals is connected to a portion of said pellet by means of a fine wire bonded to said terminal and said portion;
   - a rubberlike material encapsulating said pellet and fine wire including the junctions of said wire with said terminal and said portion; and
   - an extension of said substrate second surface at the juncture of said two portions providing a lip extending from said first surface, said encapsulating material abutting against said lip.

3. A semiconductor device as in claim 2 wherein:
   - at least one of said terminals is connected to a portion of said pellet by means of a fine wire bonded to said terminal and said portion;
   - a rubberlike material encapsulating said pellet and fine wire including the junctions of said wire with said terminal and said portion; and
   - an extension of said substrate second surface at the juncture of said two portions providing a lip extending from said first surface, said encapsulating material abutting against said lip.

5. A semiconductor device as in claims 1,2,3, or 4 wherein:
   - said substrate has a slot; and
   - said terminals comprise rods of circular cross section, one of said rods being secured to said substrate by being clamped between the walls of said slot.